United States Patent [19]

Goto et al.

[11] 4,431,973
[45] Feb. 14, 1984

[54] OPERATIONAL AMPLIFIER

[75] Inventors: Kunihiko Goto, Kawasaki; Kazuhiro Kobayashi, Tokyo; Akihiko Ito, Kawasaki; Hisami Tanaka, Yokohama; Tadahiro Saito, Kawasaki, all of Japan

[73] Assignee: Fujitsu Limited, Kawasaki, Japan

[21] Appl. No.: 279,596

[22] Filed: Jul. 1, 1981

[30] Foreign Application Priority Data

Jul. 4, 1980 [JP] Japan .................... 55-91370

[51] Int. Cl.³ .............................................. H03F 3/45
[52] U.S. Cl. ...................................... 330/261; 330/253
[58] Field of Search ................ 330/252, 253, 261, 307

[56] References Cited

U.S. PATENT DOCUMENTS 4,034,306 7/1977 Barber et al. ................... 330/261

OTHER PUBLICATIONS

Russell et al. "How the bi Fet Process Benefits Linear Circuits" Electronics Jun. 8, 1978, vol. 51, No. 12, p. 113.
"Silicon Process Shrinks OP AMP To Fit Onto Digital Chips" Electronic Jun. 8, 1978, vol. 51, No. 12, p. 69.
Tsividis et al., "A Process Insensitive NMOS Operation Amplifier" 1979 IEEE Inter. S-S Circuit Conference, p. 188.
Hoslicka "Dynamic Amplifiers in CMOS Technology" Electronics Letters Dec. 6, 1979, vol. 15, No. 25, pp. 819-820.

Primary Examiner—James B. Mullins
Assistant Examiner—Gene Wan
Attorney, Agent, or Firm—Staas & Halsey

[57] ABSTRACT

An operational amplifier comprising a differential circuit, an output amplifier having an input terminal connected to the output terminal of the differential circuit, a phase compensating circuit, including an inverting amplifier having an input terminal connected to the output terminal of the differential circuit, and a phase compensating capacitor connected between the output terminal of the inverting amplifier and the output terminal of the differential circuit. The signal delay time of the inverting amplifier is shorter than that of the output amplifier.

17 Claims, 6 Drawing Figures

OPERATIONAL AMPLIFIER

BACKGROUND OF THE INVENTION

(1) Field of the Invention

The present invention relates to an operational amplifier, and more particularly to an operational amplifier having an improved phase compensating circuit which can prevent high frequency noises on a power supply voltage from being transmitted to an output terminal of the operational amplifier.

(2) Description of the Prior Art

In general, an operational amplifier is constituted mainly by a differential circuit, an output amplifier and a phase compensating circuit. The phase compensating circuit of a conventional operational amplifier comprises a capacitor and a buffer amplifier inserted in a feedback circuit of the output amplifier and prevents the self-oscillation of the operational amplifier by decreasing the high frequency gain thereof.

However, in the conventional operational amplifier, the phase compensating circuit includes the output amplifier in a part of its signal path, and thus the signal delay time of the phase compensating circuit is longer than that of the output amplifier. Since the cut off frequency of a circuit is approximately in inverse proportion to the signal delay time of the circuit, the cut off frequency of the phase compensating circuit is lower than that of the output amplifier. Therefore, in the frequency range between the cut off frequencies of the output amplifier and the phase compensating circuit, the phase compensating circuit does not operate even though the output amplifier operates, i.e., even though the output amplifier has a gain larger than 1. As a result, noise in the above-mentioned frequency range from the operating voltage source of the operational amplifier appear at the output terminal thereof. Therefore, in the conventional operational amplifier, the SVRR, i.e., supply voltage rejection ratio with regard to the high frequency noises on the operating voltage source cannot be small, and the conventional operational amplifier requires high precision ripple filter circuits connected to the operating voltage terminals thereof. Especially in a hybrid type integrated circuit constituted by digital circuits and analog circuits containing at least an operational amplifier, the SVRR of the operational amplifier cannot be small because of the high frequeny noises superposed on the power supply voltage caused by the digital circuits.

SUMMARY OF THE INVENTION

It is therefore the principal object of the present invention to reduce the supply voltage rejection ration of an operational amplifier.

It is another object of the present invention to simplify the ripple filter circuits for an operating voltage source of an operational amplifier.

It is still another object of the present invention to stabilize the operation of an operational amplifier.

According to the present invention, there is provided an operational amplifier comprising: a differential circuit having a non-inverting input terminal, an inverting input terminal and an output terminal, for detecting the difference between input signals applied to the non-inverting input terminal and the inverting input terminal; an output amplifier having an input terminal connected to the output terminal of the differential circuit; a phase compensating circuit comprising an inverting amplifier having an input terminal connected to the output terminal of the differential circuit, and a phase compensating capacitor connected between the output terminal of the inverting amplifier and the output terminal of the differential circuit, wherein the signal delay time of the inverting amplifier is shorter than that of the output amplifier.

DESCRIPTION OF THE PREFERRED EMBODIMENTS

Figure 1A:
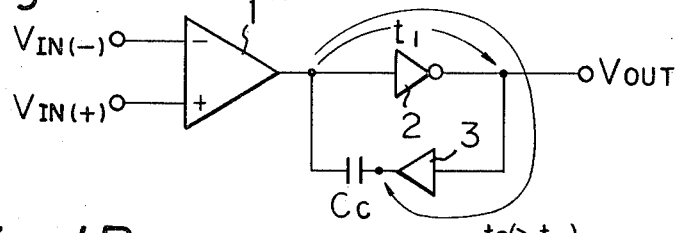
FIG. 1A and FIG. 1B are block circuit diagrams illustrating conventional operational amplifiers.
Figure 1B:
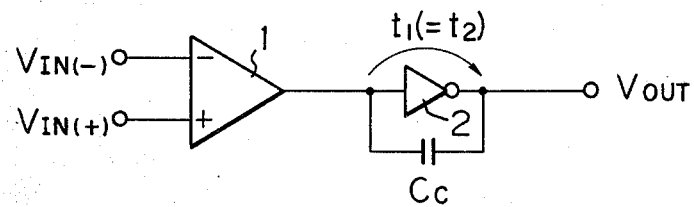

FIGS. 1A and 1B illustrate examples of conventional operational amplifiers. The operational amplifier of FIG. 1A is constituted by a differential circuit 1 which comprises a non-inverting input terminal $V_{IN}(+)$ and an inverting input terminal $V_{IN}(-)$, an output amplifier 2 which has a large gain, and a phase compensating circuit comprising a buffer amplifier 3 having a unity voltage gain and a phase compensating capacitor $C_C$ which are connected between an output terminal of the buffer amplifier 3 and an output terminal of the differential circuit 1. The operational amplifier of FIG. 1B is the same as that of FIG. 1A except that the phase compensating circuit of the operational amplifier of FIG. 1B does not include the buffer amplifier 3 for impedance matching.

In the structure of FIG. 1A, the signal delay time $t_1$ from the output terminal of the differential circuit 1 to the output terminal $V_{OUT}$ of the output amplifier 2 is shorter than the signal delay time $t_2$ from the output terminal of the differential circuit 1 through the output amplifier 2 and the buffer amplifier 3 to the output terminal of the buffer amplifier 3. In the circuit of FIG. 1B which does not include the buffer amplifier 3, the above mentioned delay times $t_1$ and $t_2$ are equal to each other. The phase compensating capacitor $C_C$ operates so as to reduce the high frequency gain of the operational amplifier and to prevent the self-oscillation thereof. It should be noted that, in the circuits of both FIGS. 1A and 1B, the capacitance of the capacitor $C_C$ is multiplied by the magnitude of the gain of the output amplifier 2 due to well-known Miller effect (The buffer amplifier 3 has, as mentioned above, a unity voltage gain.). In other words, since the phase compensating loop circuit includes the output amplifier 2 and the capacitance of the capacitor $C_C$ is increased by the magnitude of the output amplifier 2, the area occupied by the capacitance $C_C$ on the semiconductor substrate of an operational amplifier integrated circuit can be very small.

Figure 2:
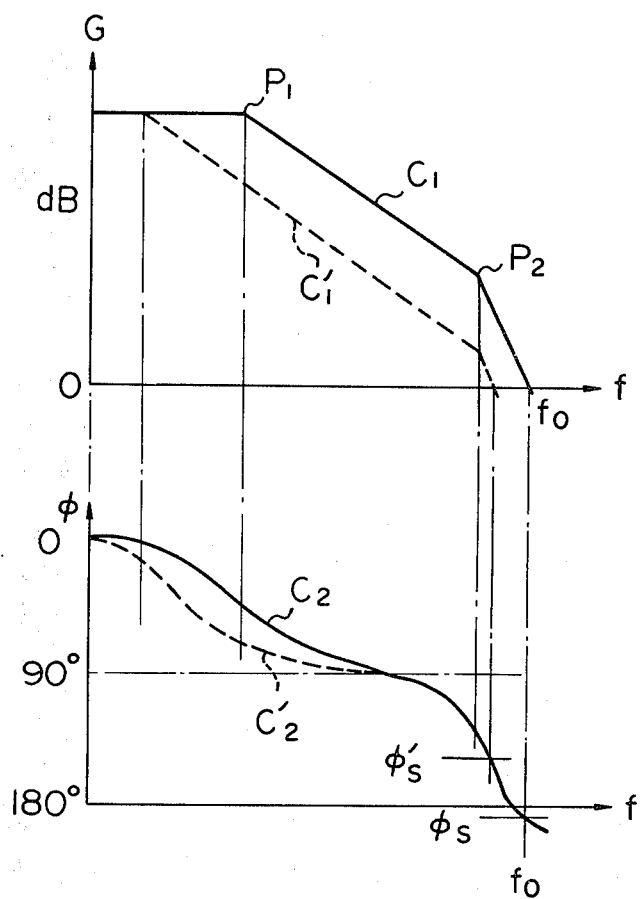
FIG. 2 is a Bode diagram illustrating characteristics of a general operational amplifier.

FIG. 2 is a Bode diagram illustrating characteristics of an operational amplifier. In FIG. 2, a curve $C_1$ shows a gain-frequency characteristic and a curve $C_2$ shows a phase-frequency characteristic. The horizontal axes of FIG. 2 designate frequency f in a logarithmic scale and the vertical axes designate gain G in a decibel scale and phase angle $\phi$ in degrees. The curve $C_1$ designates the gain-frequency characteristic by using connecting solid lines for approximation. Each of break points $P_1$ and $P_2$ is called a pole. The gain characteristic designated by the curve $C_1$ decreases with a negative slope of 6 dB per octave after the first pole $P_1$, and with a negative slope of 12 dB per octave after the second pole $P_2$. Of course, a third or fourth order system has also a third pole or a fourth pole. The maximum phase lag of the first, second, third, . . . order lag system is 90°, 180°, 270°, . . . .

Assume that the curves $C_1$ and $C_2$ designate characteristics of a negative feedback amplifier. In such a negative feedback amplifier, if the phase lag $\phi_S$ at the frequency $f_0$ at which the curve $C_1$ crosses the horizontal axis (i.e., the gain of the negative feedback amplifier is equal to zero dB is less than 180°), the negative feedback amplifier does not oscillate by itself. However, if the phase lag $\phi_S$ at the frequency $f_0$ is larger than 180°, the negative feedback amplifier may oscillate by itself because in such a condition the negative feedback becomes positive feedback. Of course the second order lag system does not oscillate by itself, because the maximum phase lag of the second order lag system is 180°. However, in a practical feedback amplifier such as the operational amplifier of FIG. 1A or FIG. 1B, where the amplifier is a third or fourth or subsequent order system, there is a possibility of self-oscillation. The phase compensating capacitor $C_C$ of the operational amplifier of FIG. 1A or FIG. 1B operates so as to decrease the high frequency gain as shown by a curve $C'_1$ designated by a dotted line, and self-oscillation of the operational amplifier can be prevented. The curve $C'_2$, designated by a dotted line, shows a phase-frequency characteristic corresponding to the curve $C'_1$.

As is well known, the signal delay of a circuit influences the gain characteristic and the phase characteristic thereof, and a cut-off frequency of the circuit at which the gain of the circuit becomes 0 dB is approximately in reverse proportion to the signal delay time of the circuit. Therefore, in the conventional operational amplifier of FIG. 1A or FIG. 1B in which the signal delay time $t_1$ of the output amplifier 2 is shorter less than or equal to the signal delay time $t_2$ of the phase compensating circuit (i.e., $t_1 \leq t_2$), the cut-off frequency $f_1$ of the output amplifier 2 is greater than or equal to the cut-off frequency $f_2$ of the phase compensating circuit, i.e., $f_1 \geq f_2$. This means that there is a frequency range in which the phase compensating circuit does not operate even though the output amplifier 2 is still operable, i.e., the output amplifier 2 has a gain larger an 0 dB. Therefore, in the above-mentioned frequency range, the gain of the output amplifier undesirably increases and there is a possibility of self-oscillation. Since the output amplifier 2 does not operate at frequencies higher than $f_1$, the above-mentioned frequency range coincides with the range between $f_2$ and $f_1$, and undesirable signals and/or noises in this frequency range appear at the output terminal $V_{OUT}$ of the output amplifier 2. Usually, the cut-off frequency of the differential circuit 1 is lower than the cut-off frequency $f_2$ of the phase compensating circuit. Thus, the signal source of the undesirable signals and/or noises is not an input signal circuit connected to the operational amplifier but an operating voltage source of the operational amplifier. Therefore, in the conventional operational amplifier, the SVRR cannot be made sufficiently small, and, when high frequency noises are superposed on the operating voltage, the high frequency noises appear at the output terminal $V_{OUT}$.

Figure 3A:
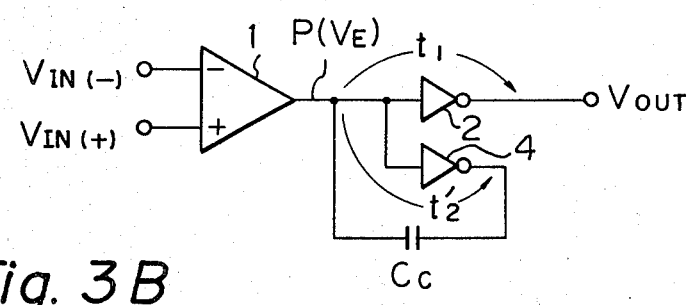
FIG. 3A and 3B are block circuit diagrams illustrating first and second embodiments of the operational amplifier of the present invention, respectively.
Figure 3B:
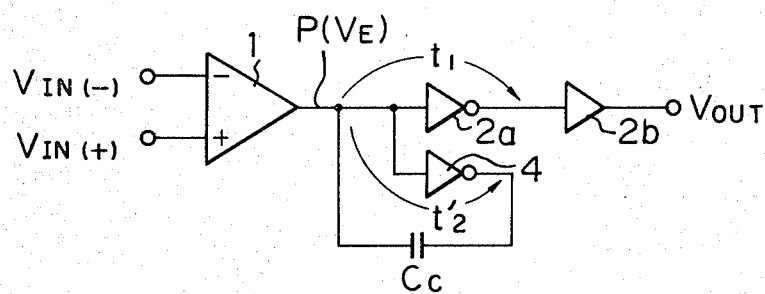

FIG. 3A and 3B illustrate first and second embodiments of the operational amplifier of the present invention. In these figures, the elements which appear in FIGS. 1A and 1B are designated by the same reference numbers and a detailed explanation thereof is omitted here. The operational amplifier of FIG. 3A comprises a differential circuit 1, an output amplifier 2, a phase compensating capacitor $C_C$ and an inverting amplifier 4. The operational amplifier of FIG. 3A differs from that of FIG. 1A or 1B in that the phase compensating circuit is not constituted by using the buffer amplifier 3 but is constituted by using another inverting amplifier 4 having an input terminal connected to the output terminal of the differential circuit 1 and having an output terminal connected through the phase compensating capacitor $C_C$ to the same output terminal of the differential circuit 1. The inverting amplifier 4 has, for example, the same circuit structure as the output amplifier 2, and has a smaller signal delay time $t'_2$ than the signal delay time $t_1$ of the output amplifier 2, i.e, $t_1 > t'_2$. In order to gain such a difference in the delay time, for example, the drive capacity of the output amplifier 2 is decreased by making the load of the output amplifier 2 relatively heavy and/or by making the size of the transistors of the output amplifier 2 relatively small. It is also preferable to increase the drive capacity of the inverting amplifier 4 of the phase compensating circuit by decreasing the load of the inverting amplifier 4 and/or by increasing the size of the transistors of the inverting amplifier 4.

The operational amplifier of FIG. 3A operates as follows. The differential circuit 1 produces, at an output terminal P thereof, an output signal corresponding to the difference between input signals applied to a non-inverting input terminal $V_{IN}(+)$ and to an inverting input terminal $V_{IN}(-)$. The output signal from the differential circuit 1 is amplified by the output amplifier 2 which produces an output signal of the operational amplifier at the output terminal $V_{OUT}$. In FIG. 3A, since the phase compensating capacitor $C_C$ is connected between the input and output terminals of the inverting amplifier 4, and since the input terminal of the inverting amplifier 4 is connected to the output terminal P of the differential circuit 1, the equivalent load capacitance of the differential circuit 1 is approximately equal to the capacitance of the capacitor $C_C$, which is multiplied by the magnitude of the gain of the inverting amplifier 4 due to the Miller effect. The equivalent load capacitance of the differential circuit 1 decreases the high frequency gain and prevents the self-oscillation of the operational amplifier.

In the structure of FIG. 3A, the signal delay time $t'_2$ of the inverting amplifier 4 is smaller than the signal delay time $t_1$ of the output amplifier 2, and thus the cut-off frequency $f_1$ of the output amplifier 2 is lower than the cut-off frequency $f'_2$ of the phase compensating circuit, i.e., $f_1 < f'_2$. Therefore, the phase compensating circuit operates over the whole frequency range in which the output amplifier 2 operates. As a result, even when noises, having higher frequencies than the cut-off frequency $f'_2$ of the phase compensating circuit are superposed on the operating voltage, the high frequency noises are not amplified and do not appear at the output terminal $V_{OUT}$, so that the SVRR is very small.

The operational amplifier of FIG. 3B has the same structure as that of FIG. 3A except that an output amplifier stage is constituted by a high gain inverting amplifier $2a$ and a buffer amplifier $2b$ used for impedance matching. The operation of the operational amplifier of FIG. 3B is approximately the same as that explained above with regard to the operational amplifier of FIG. 3A.

Figure 4:
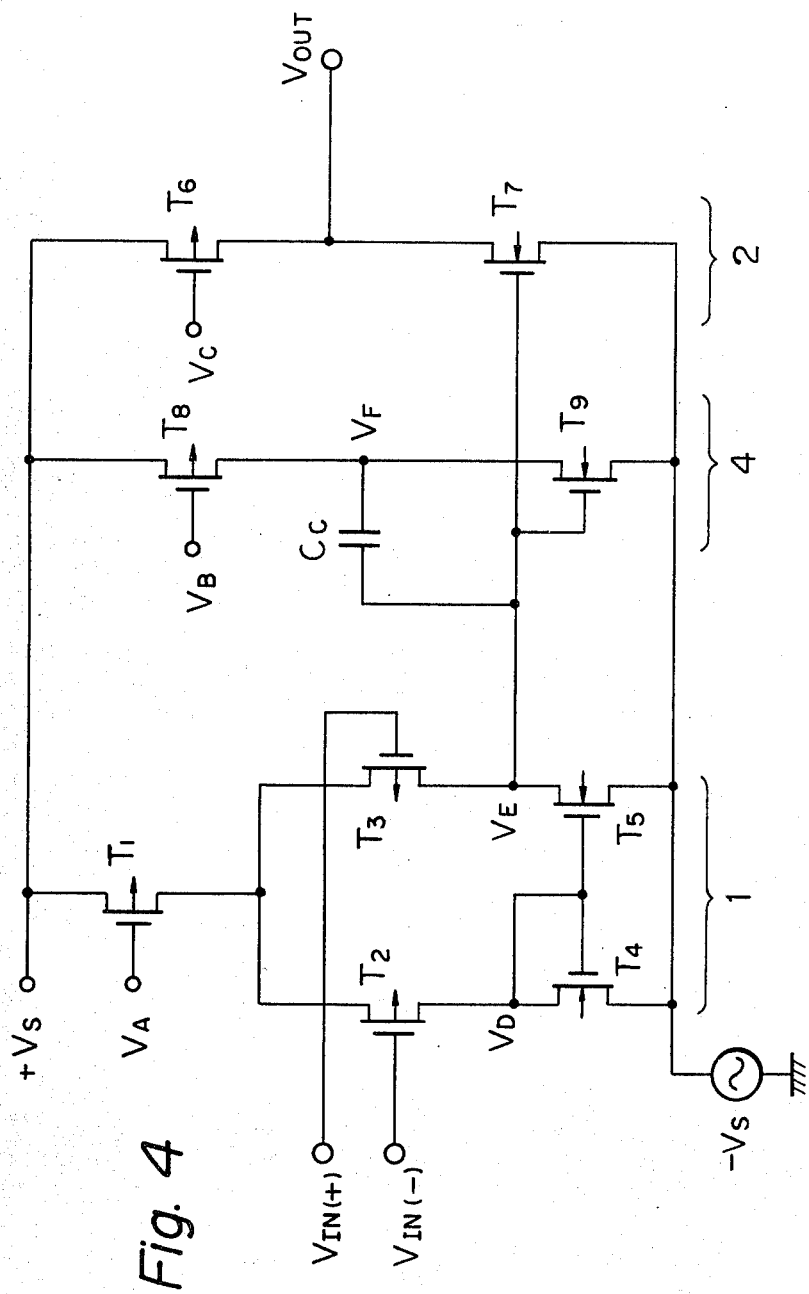
FIG. 4 is a circuit diagram illustrating the circuit structure of the operational amplifier of FIG. 3A.

FIG. 4 illustrates a detailed circuit of the operational amplifier of FIG. 3A, comprising MOS field effect transistors and operated by a positive operating voltage source $+V_S$ and a negative operating voltage source $-V_S$. In FIG. 4, transistors $T_1$ through $T_5$ form the differential circuit 1, transistors $T_6$ and $T_7$ form the output amplifier 2, and transistors $T_8$ and $T_9$ form the inverting amplifier 4 of the phase compensating circuit. The transistor $T_1$ of the differential circuit 1 constitutes a constant current source whose gate electrode is supplied with a control voltage $V_A$. The transistors $T_2$ and $T_3$ are the same size, i.e., have the same channel length and channel width, so that these transistors have the same electrical characteristics. The transistors $T_4$ and $T_5$ also have the same size and the same electrical characteristics. The transistors $T_2$ and $T_3$ detect the voltage difference between the input voltages applied to the non-inverting input terminal $V_{IN}(+)$ and the inverting input terminal $V_{IN}(-)$, and generate an input voltage $V_E$ at the drain electrode of the transistor $T_3$. The diode connected transistor $T_4$ determines the center value of the output voltage $V_E$ which is equal to the center value of a voltage $V_D$ at the drain electrode of the transistor $T_4$. The transisotr $T_6$ of the output amplifier 2 constitutes a constant current source whose gate electrode is supplied with a control voltage $V_C$. The transistor $T_7$ is a driver transistor which amplifies the output voltage $V_E$ from the differential circuit 1 and which operates in the saturation region of the drain current. The transistor $T_8$ of the inverting amplifier 4 constitutes a constant current source whose gate electrode is supplied with a control voltage $V_B$. The transistor $T_9$ is a driver transistor which amplifies the output voltage $V_E$ from the differential circuit 1 and drives the phase compensating capacitor $C_C$.

It is preferable to set the size of the transistors $T_6$ and $T_7$ of the output amplifier 2 and the transistors $T_8$ and $T_9$ so as to satisfy the following relationship.

$$W8/L8 = kW6/L6 \quad (1)$$

$$W9/L9 = kW7/L7 \quad (2)$$

where, W9 through W6 designate the channel width of the transistors $T_9$ through $T_6$, L9 through L6 designate the channel length of the transistors $T_9$ through $T_6$ and k is a constant number. In order to make the drive capacity of the inverting amplifier 4 larger than that of the output amplifier 2 and to make the delay time of the inverting amplifer 4 shorter than that of the output amplifier 2, the constant number k in the formulas (1) and (2) is made larger than 1. When the sizes of the transistors $T_6$ through $T_9$ are set so as to satisfy the formulas (1) and (2), the design of the circuit patterns of the operational amplifier becomes simple and easy.

In the circuit of FIG. 4, since the transistor $T_4$ of the differential circuit 1 is diode-connected and has a high response speed, the high frequency noises superposed on the power supply voltage $-V_S$ are delivered to the node $V_D$ of FIG. 4 in the same phase even when the frequencies of the high frequency noises are higher than the aforementioned cut-off frequency $f_1$ of the output amplifier 2. In order to suppress the appearance of the high frequency noises at the output terminal $V_{OUT}$ of the operational amplifier, it is necessary that the output signal $V_E$ of the differential circuit 1 is changed in the same phase in dependence upon the high frequency noises on the power supply voltage $-V_S$. The phase compensating circuit is used for this purpose.

As mentioned before, the cut-off frequency $f'_2$ of the inverting amplifier 4 is greater than the cut-off frequency $f_1$ of the output amplifier 2 and, therefore, the delay time $t'_2$ of the inverting amplifier 4 is shorter than the delay time $t_1$ of the output amplifier 2. Therefore, the variation of the potential of the node $V_E$ affects firstly the potential of the output node $V_F$ of the inverting amplifier 4, rather than the potential of the output terminal $V_{OUT}$. When the potential difference between the node $V_E$ and the negative voltage source $-V_S$ becomes small, the gate potential of the transistor $T_9$ falls and the potential of the node $V_F$ rises so as to conduct a constant current determined by the transistor $T_8$. The potential rise of the node $V_F$ is delivered through the capacitor $C_C$ to the node $V_E$ of the differential circuit 1, and the potential fall of the node $V_E$ is suppressed. In contrast, when the potential difference between the node $V_E$ and the voltage source $-V_S$ becomes large, the potential of the node $V_F$ falls and the potential rise of the node $V_E$ is suppressed. Therefore, the potential difference between the node $V_E$ and the negative voltage source $-V_S$ is kept at a constant value and the high frequency noises do not appear at the output terminal $V_{OUT}$ in the operating frequency range of the phase compensating circuit which is lower than the cut-off frequency $f'_2$ thereof. In the frequency range higher than the cut-off frequency $f_1$ of the output amplifier 2, the high frequency noises do not appear at the output terminal $V_{OUT}$ because, in such a frequency range higher than $f_1$, the output amplifier 2 does not operate. Therefore, since the cut-off frequency $f'_2$ is higher than the cut-off frequency $f_1$, the high frequency noises from the operating voltage source do not appear at the output terminal $V_{OUT}$ of the operational amplier for any frequency and the SVRR can be very small.

According to the present invention, it is not necessary to use high precision ripple filter circuits connected to the operating voltage terminals of the operational amplifier, and the SVRR of the operational amplifier can be very small even when the operational amplifier is combined with digital circuits in a hybrid type integrated circuit device.

We claim:

1. An operational amplifier operatively connectable to receive first and second input signals, comprising:
   a differential circuit, having a non-inverting input terminal operatively connectable to receive the first input signal, having an inverting input terminal operatively connectable to receive the second input signal, and having an output terminal, for detecting a potential difference between the first and second input signals;
   an output amplifier having an input terminal connected to said output terminal of said differential circuit; and
   a phase compensating circuit comprising:
      an inverting amplifier having an input terminal connected to said output terminal of said differential circuit and having an output terminal; and
      a phase compensating capacitor connected between said output terminal of said inverting amplifier and said output terminal of said differential circuit, said inverting amplifier having a signal delay time less than the signal delay time of said output amplifier.

2. An operational amplifier as set forth in claim 1, wherein said differential circuit comprises:
   a constant current source circuit;
   a pair of differential transistors operatively connected to said constant current source circuit, said non-inverting input terminal, and said inverting input terminal; and
   a pair of load transistors operatively connected to said pair of differential transistors.

3. An operational amplifier as set forth in claim 2, wherein said pair of differential transistors are field effect transistors having source electrodes commonly connected to said constant current source circuit.

4. An operational amplifier as set forth in claim 3, wherein said constant current source circuit comprises a field effect transistor which is operated in the saturation region of the drain current.

5. An operational amplifier as set forth in claim 3, wherein each of said pair of differential transistors has substantially the same electrical characteristics.

6. An operational amplifier as set forth in claim 2, wherein said pair of load transistors are field effect transistors, one of which is a diode-connected transistor.

7. An operational amplifier as set forth in claim 6, wherein each of said pair of load transistors has substantially the same electrical characteristics.

8. An operational amplifier as set forth in claim 1, wherein said output amplifier comprises a drive transistor connected to said output of said differential circuit, and a constant current source circuit connected to said drive transistor.

9. An operational amplifier as set forth in claim 8, wherein said drive transistor is a field effect transistor.

10. An operational amplifier as set forth in claim 9, wherein said constant current source circuit of said output amplifier comprises a field effect transistor which is operated in the saturation region of the drain current.

11. An operational amplifier as set forth in claim 1, wherein said inverting amplifier comprises a drive transistor connected to said phase compensating capacitor and said output of said differential circuit, and a constant current source circuit connected to said drive transistor.

12. An operational amplifier as set forth in claim 11, wherein said drive transistor is a field effect transistor.

13. An operational amplifier as set forth in claim 12, wherein said constant current source circuit of said inverting amplifier comprises a field effect transistor which is operated in the saturation region of the drain current.

14. An operational amplifier as set forth in claim 1, wherein said output amplifier comprises:
   a high gain amplifier section connected to the output of said differential circuit; and
   a buffer amplifier section connected to said high gain amplifier section.

15. An operational amplifier as set forth in claim 1, wherein said output amplifier and said inverting amplifier have substantially the same circuit structure.

16. An operational amplifier operatively connectable to receive first and second input signals, comprising:
   a differential circuit, having a non-inverting input terminal operatively connectable to receive the first input signal, having an inverting input terminal operatively connectable to receive the second input signal, and having an output terminal, for generating a difference signal at said output terminal;
   an output amplifier having an input terminal connected to said output terminal of said differential circuit, and having a first cut-off frequency; and
   a phase compensating circuit having a second cut-off frequency greater than said first cut-off frequency, said phase compensating circuit comprising:
      an inverting amplifier having an input terminal connected to said output terminal of said differential circuit, and having an output terminal; and
      a phase compensating capacitor connected between said output terminal of said inverting amplifier and said output terminal of said differential circuit.

17. An operational amplifier as set forth in claim 16, wherein said output amplifier comprises first and second transistors,
   wherein said inverting amplifier comprises third and fourth transistors, and
   wherein the transistors satisfy the following equations:

$$Ti\ W3/L3 = kW1/L1$$

$$W4/L4 = kW2/L2$$

where W1 through W4 designate the channel width of the first through the fourth transistors, respectively, where L1 through L4 designate the channel length of the first through fourth transistors, respectively, and where k is a constant greater than 1.

* * * * *

UNITED STATES PATENT AND TRADEMARK OFFICE
CERTIFICATE OF CORRECTION

PATENT NO. : 4,431,973

DATED : FEBRUARY 14, 1984

INVENTOR(S) : KUNIHIKO GOTO ET AL.

It is certified that error appears in the above-identified patent and that said Letters Patent is hereby corrected as shown below:

Title page:

[56] OTHER PUBLICATIONS
line 1, "bi Fet" should be --bi-Fet--;
line 4, delete "42";
line 6, "Operation" should be --Operational--;
line 7, "Circuit" should be --Circuits--.

Col. 1, line 53, "ration" should be --ratio--.

Col. 3, line 11, after "$\phi_S$" insert --,--;
line 17, after "itself" insert --,--;
line 26, "$C_c$" should be --$C_C$--;
line 40, delete "shorter";
line 48, "an" should be --Than--.

UNITED STATES PATENT AND TRADEMARK OFFICE
CERTIFICATE OF CORRECTION

PATENT NO. : 4,431,973

DATED : FEBRUARY 14, 1984

INVENTOR(S) : KUNIHIKO GOTO ET AL.

It is certified that error appears in the above-identified patent and that said Letters Patent is hereby corrected as shown below:

Col. 4, line 9, "3" should be --3,--.

Col. 5, line 19, "betweem" should be --between--;
      line 21, "input" (second occurrence) should be --output--;
      line 26, "transisotr" should be --transistor--.

Col. 8, line 41, delete "Ti".

Signed and Sealed this

Nineteenth Day of March 1985

[SEAL]

Attest:

DONALD J. QUIGG

Attesting Officer     Acting Commissioner of Patents and Trademarks